(12) United States Patent
Chang

(10) Patent No.: US 7,514,985 B2
(45) Date of Patent: Apr. 7, 2009

(54) FAST TURN ON AND OFF SPEED IN PLL CASCODED CHARGE PUMP

(75) Inventor: Jui-Yu Chang, Taoyuan County (TW)

(73) Assignee: RichWave Technology Corp., Taipei (TW)

( * ) Notice: Subject to any disclaimer, the term of this patent is extended or adjusted under 35 U.S.C. 154(b) by 55 days.

(21) Appl. No.: 11/668,473

(22) Filed: Jan. 30, 2007

(65) Prior Publication Data

US 2008/0180162 A1    Jul. 31, 2008

(51) Int. Cl.
*G05F 1/10* (2006.01)
(52) U.S. Cl. .................... 327/536; 327/157
(58) Field of Classification Search .......... None
See application file for complete search history.

(56) References Cited

U.S. PATENT DOCUMENTS

| | | | |
|---|---|---|---|
| 5,825,640 A | | 10/1998 | Quigley et al. |
| 5,898,336 A | * | 4/1999 | Yamaguchi ............ 327/157 |
| 6,160,432 A | * | 12/2000 | Rhee et al. ............ 327/157 |
| 6,316,977 B1 | * | 11/2001 | Sargeant ............ 327/157 |
| 6,320,470 B1 | * | 11/2001 | Arai et al. ............ 331/17 |
| 6,415,007 B1 | | 7/2002 | Kawasumi |
| 6,535,051 B2 | * | 3/2003 | Kim ............ 327/536 |
| 6,586,976 B2 | * | 7/2003 | Yang ............ 327/157 |
| 6,597,217 B2 | * | 7/2003 | Ingino, Jr. ............ 327/157 |
| 6,747,497 B2 | * | 6/2004 | Ingino, Jr. ............ 327/157 |
| 6,885,251 B2 | | 4/2005 | Delmot et al. |
| 6,891,411 B2 | * | 5/2005 | Lever ............ 327/148 |
| 7,005,896 B2 | * | 2/2006 | Chen et al. ............ 327/112 |
| 7,088,171 B2 | | 8/2006 | Neidorff |
| 2002/0075065 A1 | * | 6/2002 | Esterl et al. ............ 327/536 |

OTHER PUBLICATIONS

[Woogeun Rhee], [Design of High-Performance CMOS Charge Pumps in Phase-Locked Loops], [IEEE], [1999], [II-545~II-548], [vol.-issue number(s)], [IEEE], [USA].

* cited by examiner

*Primary Examiner*—Cassandra Cox
(74) *Attorney, Agent, or Firm*—Winston Hsu

(57) ABSTRACT

A charge pump includes a first switch coupled between a first voltage source and a first node, second switch coupled between the first node and a second node, a third switch coupled between the second node and a third node, the third node is for outputting from the charge pump. A fourth switch is coupled between the output node and a fourth node, a fifth switch is coupled between the fourth node and a fifth node, and a sixth switch is coupled between the fifth node and ground. A seventh switch is coupled between ground and the first node and an eighth switch is coupled between a second voltage source and the fifth node. A first capacitor is coupled between the second node and a first voltage signal and a second capacitor is coupled between the fourth node and a second voltage signal.

7 Claims, 10 Drawing Sheets

FAST TURN ON AND OFF SPEED IN PLL CASCODED CHARGE PUMP

BACKGROUND OF THE INVENTION

1. Field of the Invention

The present invention relates generally to a charge pump utilized in a phase locked loop, and more particularly to a charge pump having fast turn on and turn off response times.

2. Description of the Prior Art

A charge pump can be an important component when utilizing a phase locked loop (PLL) to obtain a specific frequency. Commonly a phase and frequency detector (PFD) receives as input a reference frequency signals and a divided frequency signals outputted by a voltage controlled oscillator (VCO). The PFD outputs an UP signal if the phase of the reference frequency signal leads the phase of the divided frequency signal or outputs a DOWN signal if the phase of the divided frequency signal leads the phase of the reference frequency signal.

The UP and DOWN signals are sent to control switches in the charge pump to cause the charge pump to act as a current source to a low pass filter or a current sink from the low pass filter according to the respective UP and DOWN signals. The positive or negative flow of current through the low pass filter controls the VCO to adjust its output frequency accordingly. The output of the VCO is transmitted through the frequency divider and back to an input of the PFD, completing the loop. The process continues until the phases of the reference frequency and the divided frequency are aligned.

Therefore, to a great degree, the reduction of noise as well as the performance of the entire PLL depends upon the response speed of the charge pump to switch between outputting or sinking a constant current regardless of variable loads according to the received UP and DOWN signals.

Please refer to FIG. 1, which shows a conventional charge pump 100 comprising a cascoded current mirror and switch on source node of a MOS switch. The current mirror is cascoded with high output impedance so that the current variation is less sensitive to the output voltage and retains a substantially constant current level regardless of loading.

The charge pump 100 comprises a first row of cascoded switches P7, P8, and P9 in order. The source of switch P7 is coupled to VDD and the drain of switch P9 is coupled to ground via a current source Icp. The gates of switches P7, P8, and P9 are coupled to ground, a node F, and a first input voltage Vb1 respectively.

A second row of cascoded switches P6, P3, P4, N3, N4, and N6 in order are also comprised by the charge pump 100 as are a third row of cascoded switches P5, P1, P2, N1, N2, and N5 in order. The source of switches P6 and P5 are each coupled to VDD and the source of switches N6 and N5 are each coupled to ground. The gates of the second row of cascoded switches P6, P3, P4, N3, N4, and N6 are coupled to ground, the node F, the first input voltage Vb1, a second input voltage Vb2, a node H, and VDD respectively. The gates of the third row of cascoded switches P5, P1, P2, N1, N2, and N5 are coupled to a signal UPB, the node F, the first input voltage Vb1, the second input voltage Vb2, the node H, and a signal DN respectively. Node F is also coupled with a node G, which is in turn coupled between the drain of switch P4 and the drain of switch N3.

There are also capacitors C1 formed between VDD and a node E, which is coupled to the NODE F, and C2 formed between ground and the node H. The signals DN and UPB are derived from the UP and DOWN signals outputted by the PFD described earlier and are utilized to alternate the charge pump 100 between a current source and a current sink. UPB is an inverted version of the UP signal (UP BAR), so that when the signal UP goes from high to low, UPB goes from low to high and visa versa.

Switches P1-P9 function to cause the charge pump 100 to act as a current source and switches N1-N5 function to cause the charge pump 100 to act as a current sink. In these embodiments, switches P1-P9 are P-MOS transistors and switches N1-N5 are N-MOS transistors but a reversal of these P and N characteristics and accompanying adjustments is to be considered well within the scope of the present invention and present in other embodiments.

Please refer to FIG. 2 in conjunction with FIG. 1 for an example description of the operation of the charge pump 100. FIG. 2 is a timing diagram showing the relative voltages at the switches N1 and N2 as the charge pump 100 is switched from off state (no current flow out or in) to a current sink via the signal DN at the gate of switch N5. It should be noted that all indicated voltages and current values in FIG. 2, FIG. 4, and FIG. 6 are approximations given as examples only and actual results may vary depending on design considerations and manufacturing methods.

As the diagram in FIG. 2 shows, when the signal DN goes high, the switch N5 is turned on and the node D will be dragged down to 0 volts. Because the gate voltage at switch N2 maintains a relative high voltage, the voltage at the node D being reduced to 0 volts causes the switch N2 to turn on. The voltage at the source of the switch N1 then goes low because the switch N2 is turned on, causing the switch N1 to also turn on. With the switches N5, N2, and N1 all turned on, the charge pump 100 sinks current from the node 1, which may be coupled to a low pass filter, to ground. It should be apparent to one skilled in the art that a similar process is followed when the signal UPB goes from high to low at the gate of switch P5 as the charge pump 100 converts from being a current sink to being a current source.

The cascoded arrangement of the switches in the charge pump 100 essentially maintains a constant current level regardless of loading as desired. However, when the switch N5 is turned off, the node D become floating, which makes the switch N2 turn off very slow, which in turn causes the switch N1 to also turn off slowly. Please notice the circled portions of three of the waveforms in FIG. 2 that illustrate the slow rise of voltages at nodes D and C and the resulting very slow turn off of the output current from node 1. This ripple effect of having a faster transistor turning on a slower transistor, which in turn turns on a yet slower transistor, gives slow response and introduces unwanted noise into the charge pump.

SUMMARY OF THE INVENTION

It is therefore a primary objective of the claimed invention to provide a charge pump that maintains a substantially constant output current regardless of loading.

It is a second primary objective of the claimed invention to reduce the response time when turning off the charge pump.

It is a third primary objective of the claimed invention to reduce the response time when turning on the charge pump.

A charge pump according to the claimed invention includes a first switch coupled between a first voltage source and a first node, and is controlled by a signal UPB. A second switch is coupled between the first node and a second node, a third switch is coupled between the second node and a third node, the third node for output from the charge pump. A fourth switch is coupled between the output node and a fourth node, a fifth switch is coupled between the fourth node and a fifth node, and a sixth switch coupled between the fifth node and ground and controlled by a signal DN. A seventh switch is coupled between ground and the first node and controlled by a signal UP which is opposite from the signal UPB and an eighth switch is coupled between a second voltage source and the fifth node and controlled by a signal DNB which is opposite from the signal DN. A first capacitor is coupled between the first node and the second node and a second capacitor is coupled between the fourth node and the fifth node.

The capacitors effectively reduce the ripple delay when turning on the charge pump by allowing multiple cascoded switches to turn off and on approximately simultaneously while retaining the constant output current benefit of utilizing cascoded switches in the charge pump.

These and other objectives of the present invention will no doubt become obvious to those of ordinary skill in the art after reading the following detailed description of the preferred embodiment that is illustrated in the various figures and drawings.

DETAILED DESCRIPTION

The first embodiment of the present invention is directed to speeding up the response of the charge pump 100 when the switch N5 is turned off. Please refer to FIG. 3 for an explanation. The charge pump 300 comprises virtually the same structure as does the charge pump 100 with similar components identified with the same labels. The difference between the charge pump 300 and the charge pump 100 is the addition of switches P10 and N7. Switch P10 may be a P-MOS transistor while switch N7 may be an N-MOS transistor, but other variations are considered within the scope of the present invention.

The drain of switch P10 is coupled to ground and the source of switch P10 is coupled to node A, which is situated between the drain of switch P5 and the source of switch P1. The gate of switch P10 is coupled to the UP signal, which is opposite to the UPB signal previously discussed. The drain of switch N7 is coupled to VDD and the source of switch N7 is coupled to node D, which is situated between the drain of switch N5 and the source of switch N2. The gate of switch N7 is coupled to a DNB signal, which is the same as DN BAR and is opposite to the DN signal previously discussed.

Figure 3:
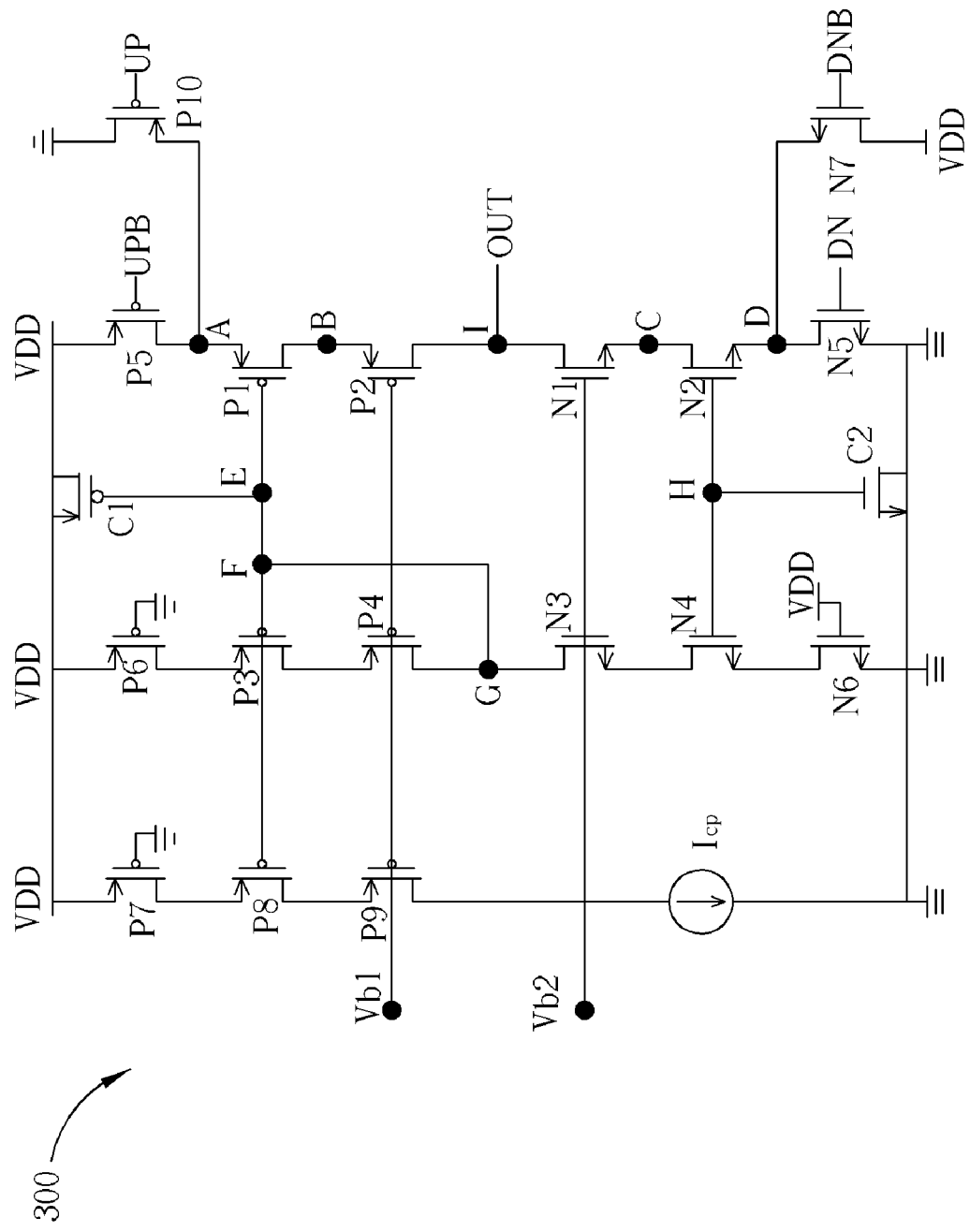
FIG. 3 is a diagram of a charge pump according to the present invention.
Figure 4:
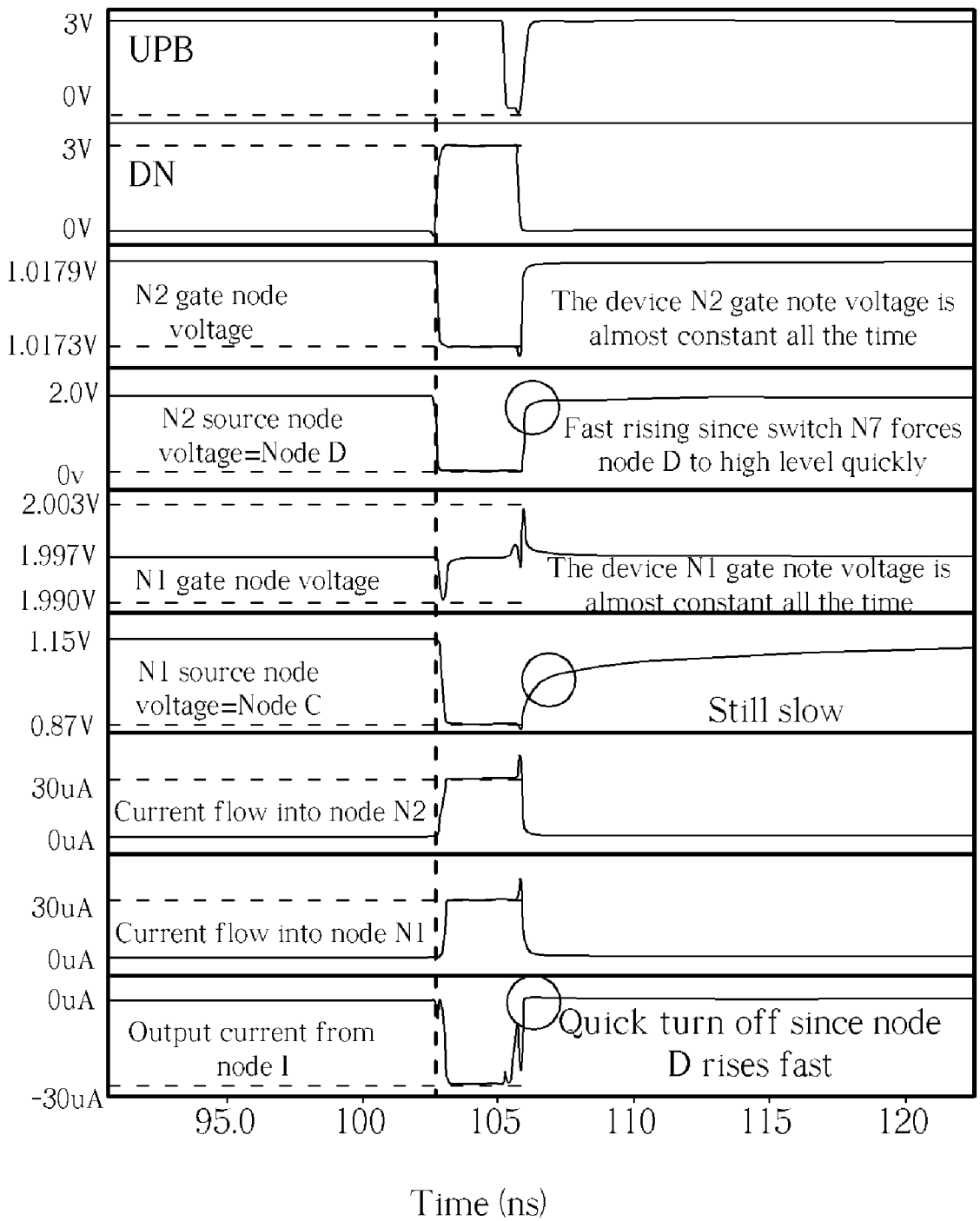
FIG. 4 is a timing diagram of the operation of the charge pump of FIG. 3.

Please refer to FIG. 4 in conjunction with FIG. 3 for an example description of the operation of the charge pump 300.

FIG. 4 is a timing diagram showing the relative voltages at the switches N1 and N2 as the charge pump 300 is switched from off state to a current sink via the signal DN at the gate of switch N5.

Figure 1:
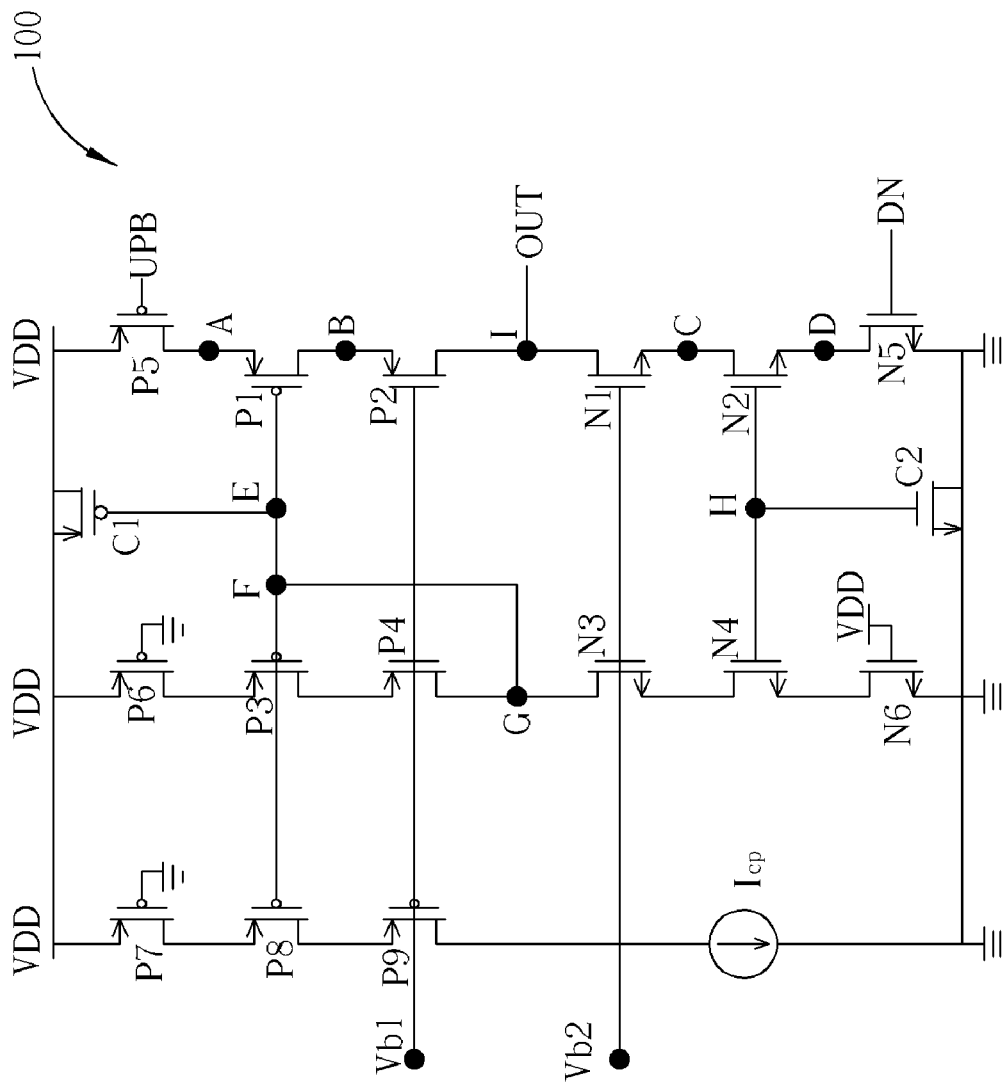
FIG. 1 is a diagram of a conventional charge pump according to the present invention.
Figure 2:
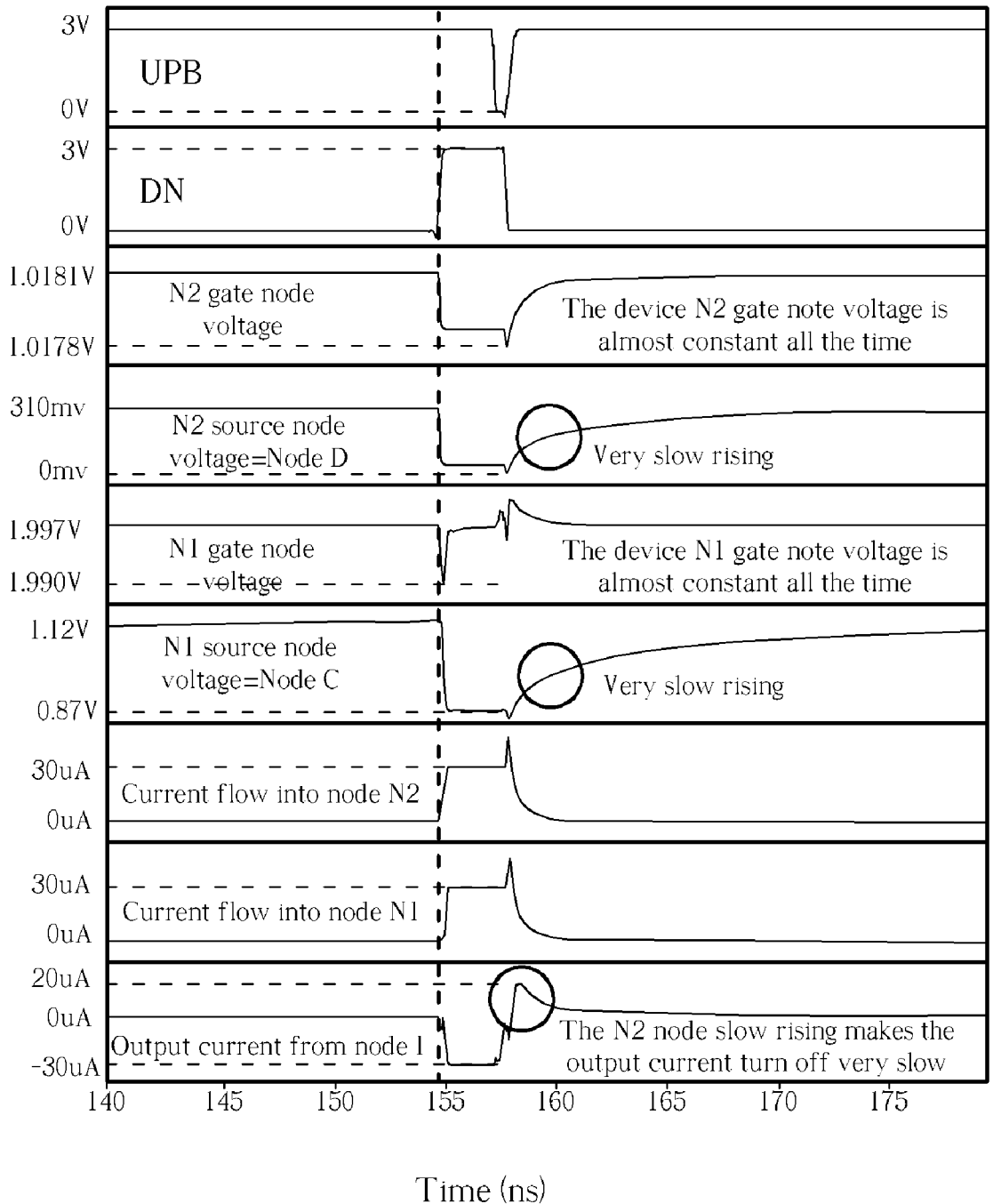
FIG. 2 is a timing diagram of the operation of the charge pump of FIG. 1.

The diagram in FIG. 4 shows that turning off the charge pump 300 is similar to turning off the charge pump 100 with the exception of improved response time due to the switch N7. As the circles in FIG. 4 show, the voltage at node D becomes very high voltage during the off stage and makes sure the switch N2 is turned off. The transition time to turn off is improved due to the switch N7 rapidly pulling node D from 0 to high voltage. Please compare this with the same waveform in FIG. 2. The voltage ramping at node C at the source of switch N1 is still relatively slow, however, there is a marked improvement in speed during turn off since the voltage at node D rises fast. Turn on operation of the charge pump 300 remains similar to that of the charge pump 100.

The charge pump 300 shows a decrease in response time required when turning off which may be viewed as an improvement over the charge pump 100. However, the current at the drain of the switch N1 turns on slower than the current at the drain of the switch N2 as the turn on sequence shows when the switch N5 turns on. The node D goes to 0 volts, and turns on the switch N2. After the switch N2 turns on, the node C voltage goes low, which then turns on the switch N1 to sink the current from node I.

There is still a ripple delay between the switch N5 being turned on and the switch N1 being turned on, with each succeeding switch depending upon the status of previous switches in the cascoded chain of switches causing the delay. This delay occurs between faster nodes and slower nodes receiving suitable voltages. The relative terms "faster" and "slower" are intended to describe the order of receiving the appropriate voltage and not necessarily the speed at which the voltages are received. Examples in FIG. 3 of a faster node and a slower node are node A being a faster node and node B being a slower node. The next embodiments of the present invention are directed to speed up the response of the charge pump 100 when the switch N5 is turned on.

Figure 5:
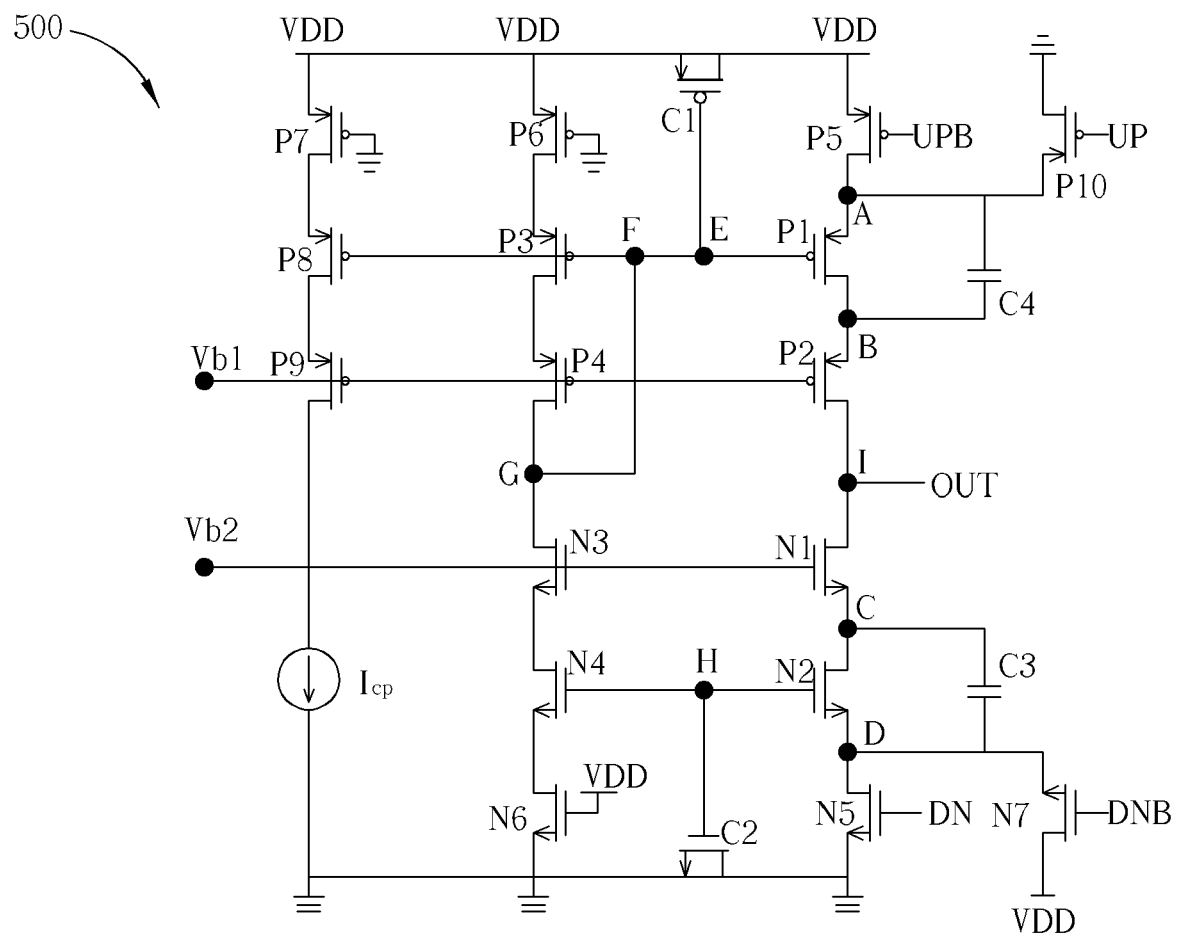
FIG. 5 is a diagram of another charge pump according to the present invention.

Please refer now to FIG. 5 that illustrates a charge pump 500 with an improved turn on speed. The charge pump 500 comprises virtually the same structure and definitions as does the charge pump 300 with similar components identified with the same labels. The difference between the charge pump 500 and the charge pump 300 is the addition of capacitors C3 and C4. One terminal of capacitor C4 is coupled to the node B (slower node) while the second terminal of capacitor C4 is coupled to a first voltage signal which may be a node B (faster node) and is situated between the drain of switch P1 and the source of switch P2. One terminal of capacitor C3 is coupled to the node C (slower node) while the second terminal of capacitor C3 is coupled to a second voltage signal which may be a node D (faster node) and is situated between the drain of switch N2 and the source of switch N1.

Figure 6:
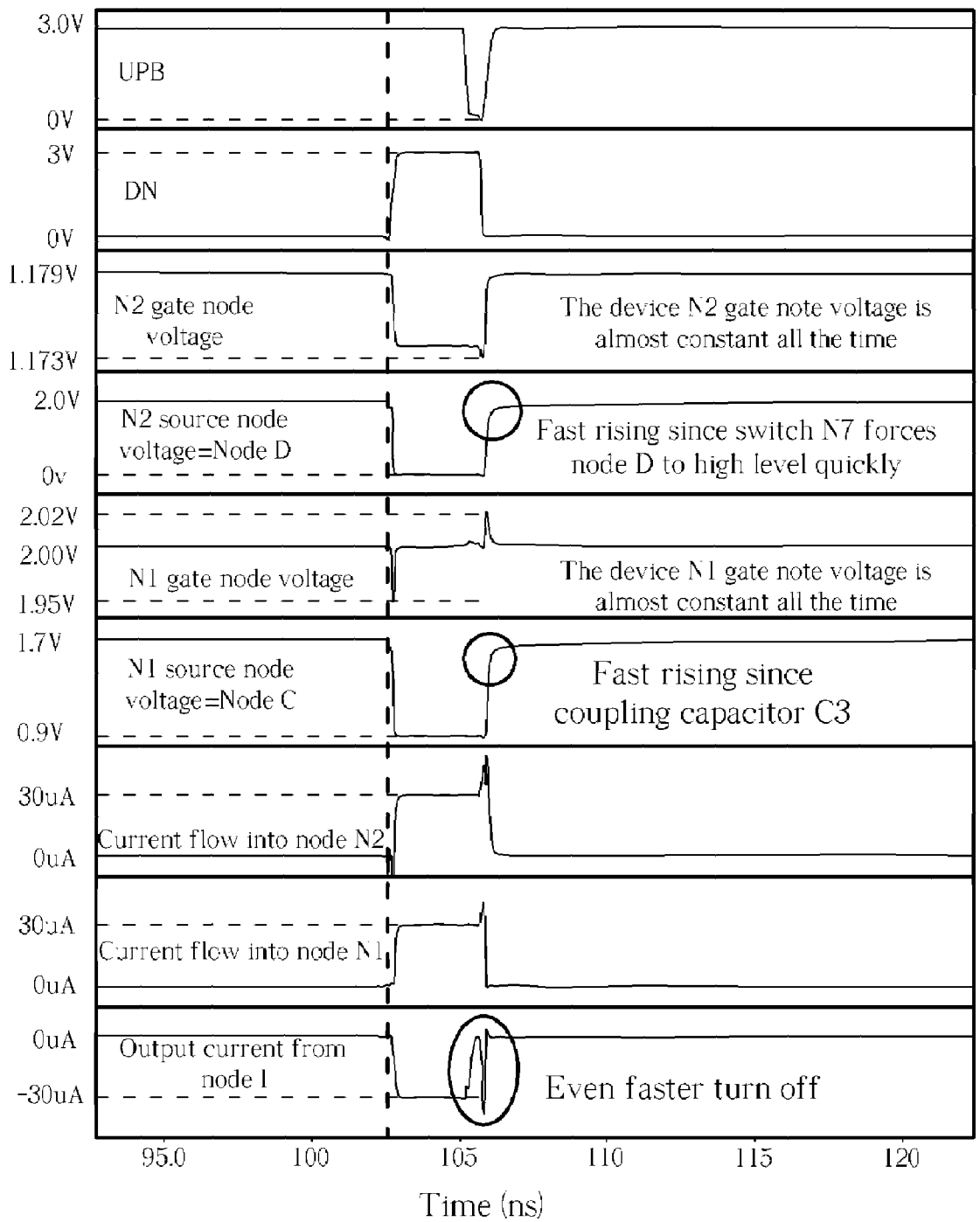
FIG. 6 is a timing diagram of the operation of the charge pump of FIG. 5.
Figure 7:
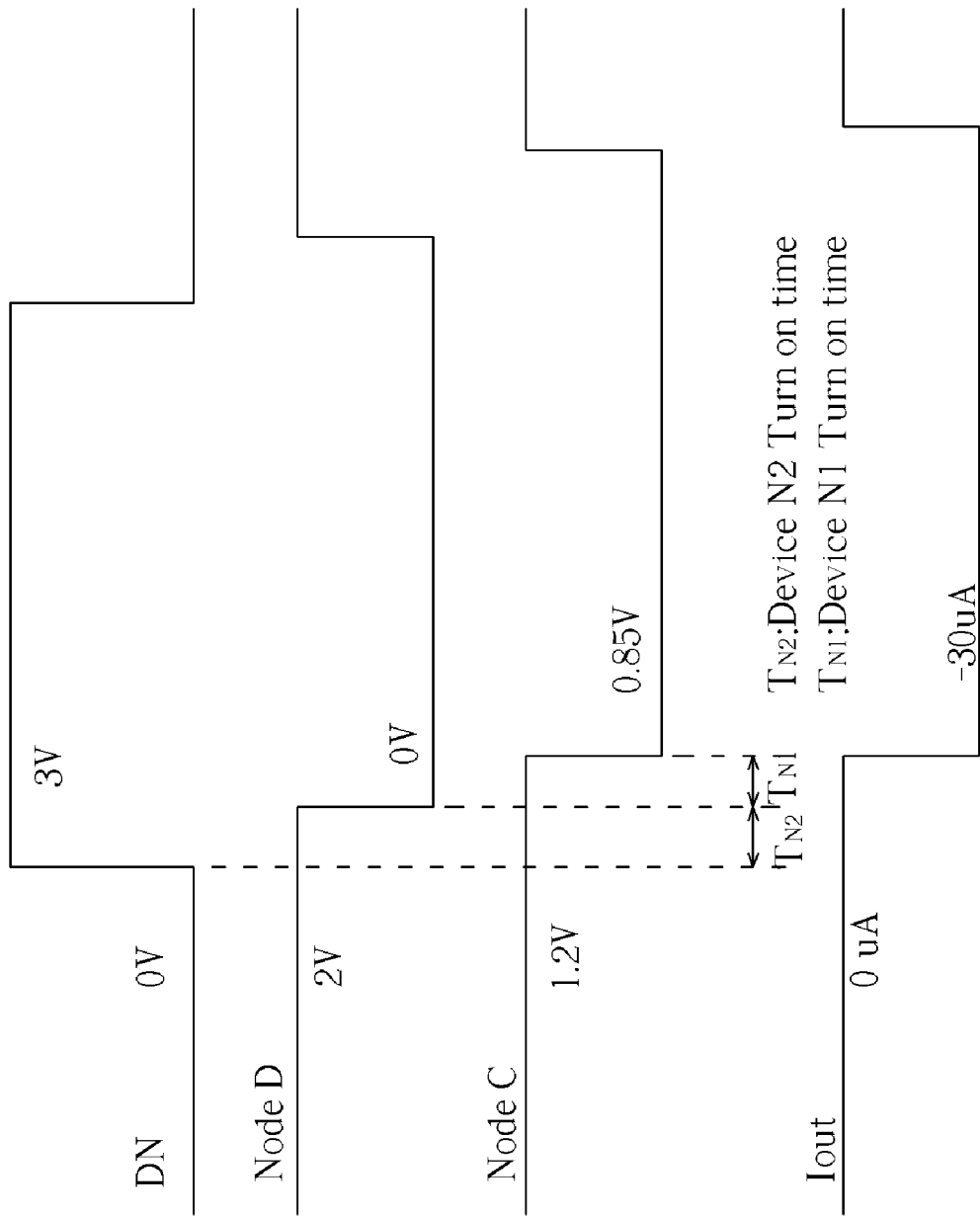
FIG. 7 illustrates voltage and current waveform timing relationships for the charge pump of FIG. 3.
Figure 8:
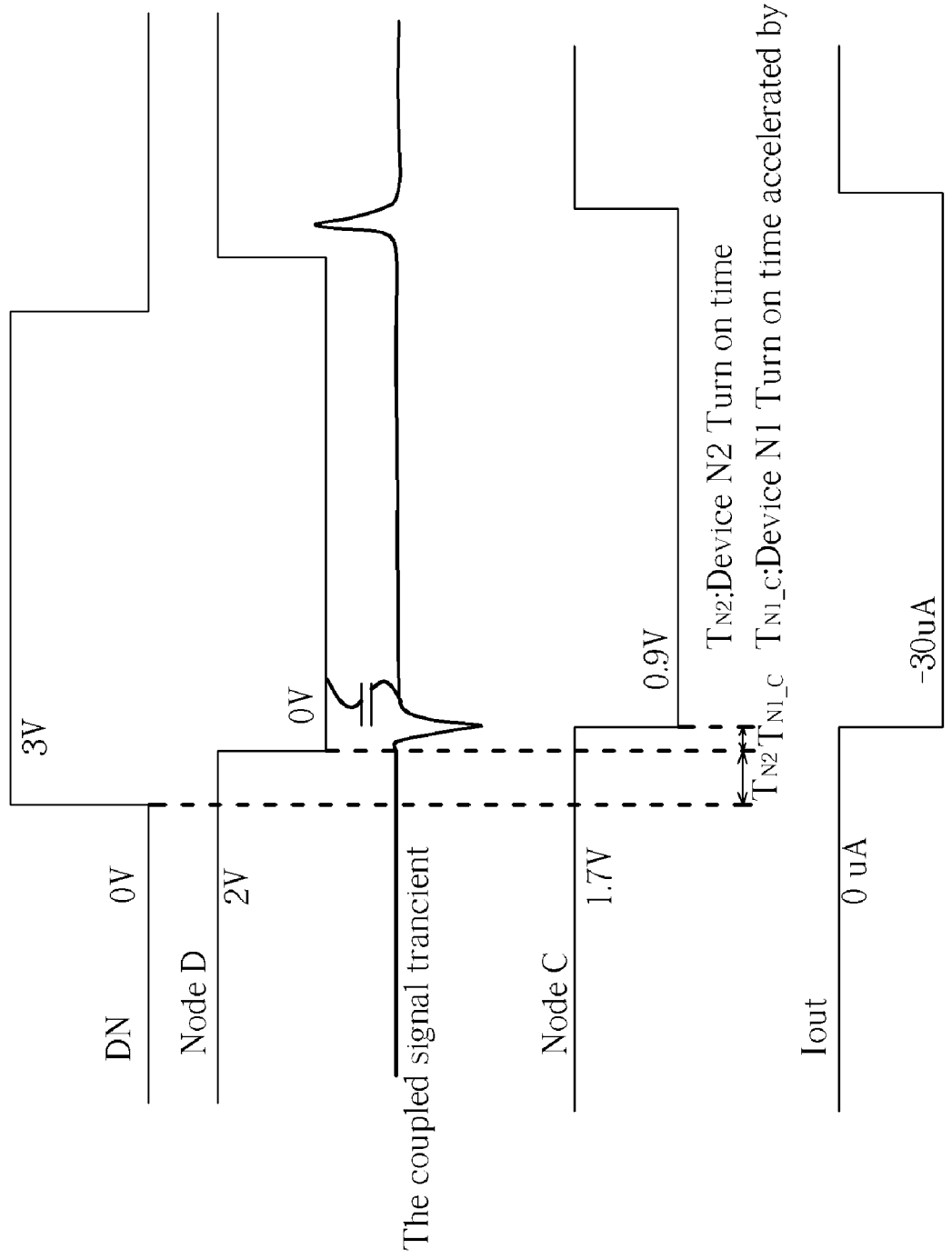
FIG. 8 illustrates voltage and current waveform timing relationships for the charge pump of FIG. 5.
Figure 9:
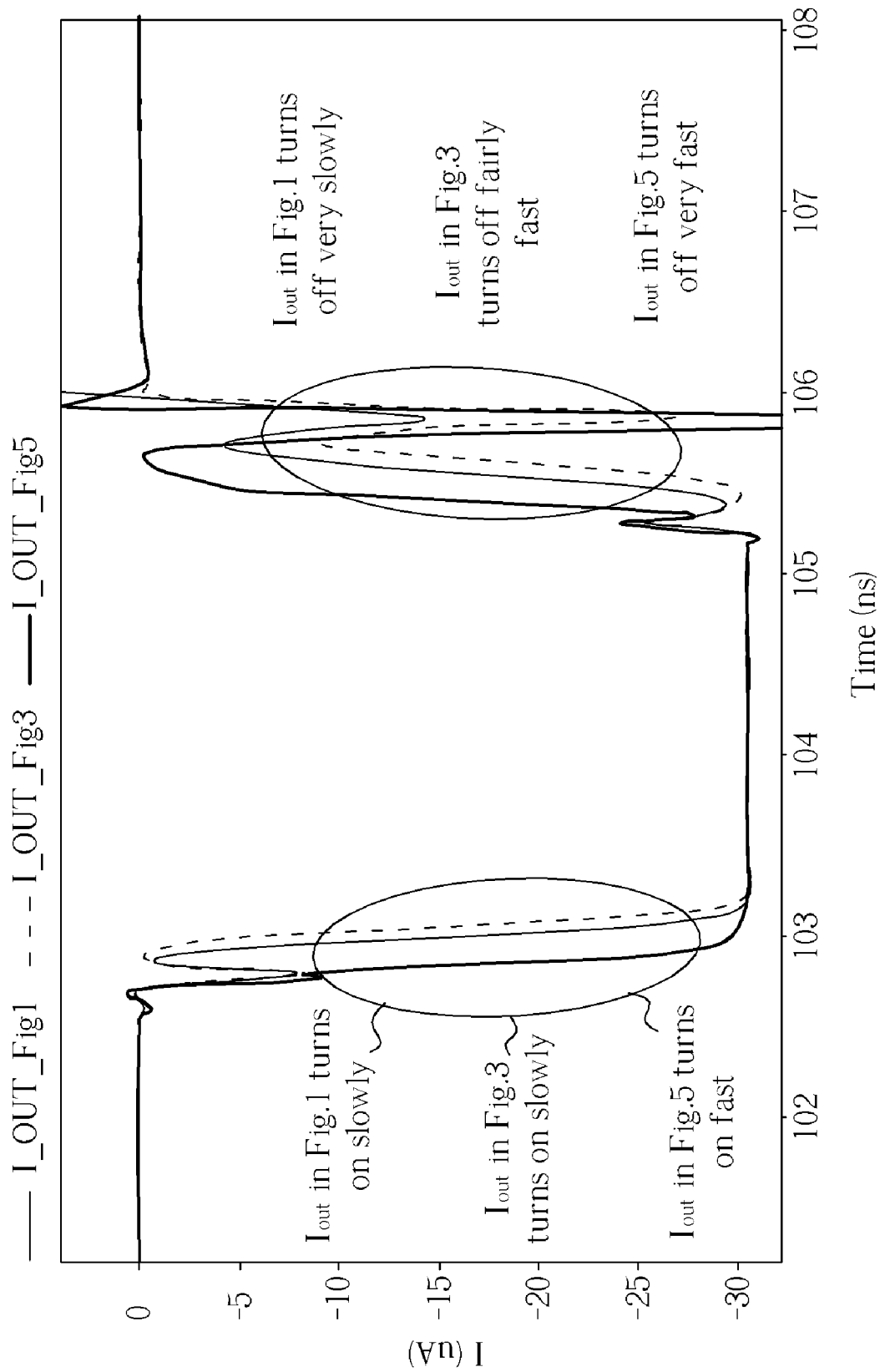
FIG. 9 is a comparison diagram of the turn on speeds of the charge pumps in FIG. 1, FIG. 3, and FIG. 5.

Please refer to FIG. 6 in conjunction with FIG. 5 for an example description of the operation of the charge pump 300. FIG. 6 is a timing diagram showing the relative voltages at the switches N1 and N2 as the charge pump 300 is switched from a current sink to a current source via the signal DN at the gate of switch N5.

The diagram in FIG. 6 shows that turning on the charge pump 500 is similar to turning on the charge pump 300 with the exception of improved response time due to the capacitor C3. FIG. 6 illustrates the current sink case, too. The node D goes low at the turn on and goes high at the turn off moment due to the switch N7. The capacitor C3 couples the node D signal as a pulse down signal at the turn on moment very instantly. This coupled signal assists node C to go to a lower voltage level faster than can the switch N2 turning on to pull node C to low voltage. The turn off stage functions similarly with the capacitor C3 pulling the node C up to a higher voltage quicker than the switch N2 turning off. The results are shown in the FIG. 6. The circles in the timing diagram reveal the node D retains the fast rising edge seen in FIG. 4, and that the voltage at node C now shows a substantial increase in voltage rising speed due to the coupling of capacitor C3. The increased rising speed results in an even faster turn on and turn off speed of the output current than was achieved in FIG. 4.

Figure 10:
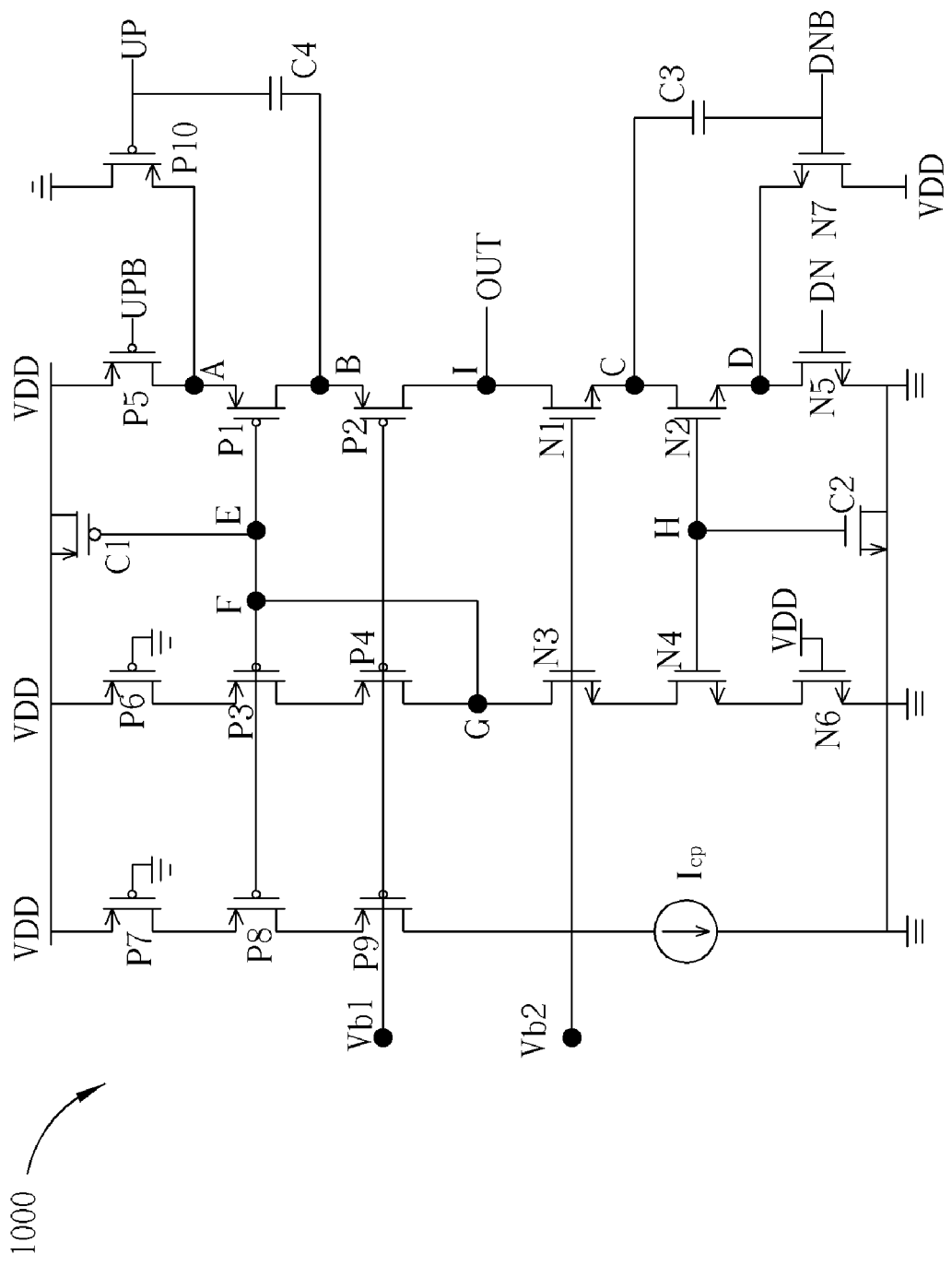
FIG. 10 is a diagram of a third charge pump according to the present invention.

Please refer now to FIG. 10 that illustrates a charge pump 1000 with a further improved turn on and off speed. The charge pump 1000 comprises virtually the same structure and definitions as does the charge pump 300 with similar components identified with the same labels. The difference between the charge pump 1000 and the charge pump 300 is again the addition of capacitors C3 and C4. One terminal of capacitor C4 is coupled to the node B (slower node) while the second terminal of capacitor C4 is coupled to a first voltage source, which may be a control signal UP discussed previously. One terminal of capacitor C3 is coupled to the node C (slower node) while the second terminal of capacitor C3 is coupled to a second voltage source which may be the DNB (Down BAR) control signal discussed previously. This arrangement of the capacitors C3 and C4 allows the slower nodes B and C to respond directly to the UP and DNB control signals speeding response time even further.

The capacitors C3 and C4 effectively reduce the ripple delay between faster nodes and slower nodes by allowing both the switches N2 and N1 to turn off and on approximately simultaneously according to the UP and DNB signals without any delay introduced by the faster nodes A and D respectively, while retaining the constant output current benefit of utilizing cascoded switches in the charge pump 500. As can be readily seen to one skilled in the art, the embodiment depicted in FIG. 10 shown a marked improvement in both turn on and turn off response time.

The present invention utilizes rows of cascoded switches to form the core of a charge pump because the cascading of switches provides a relatively constant output current regardless of loading when compared to prior art single switched charge pumps. However, the cascading of the switches slows response time by introducing an unwanted ripple delay, as turning on or off a first switch is required before a next switch is turned on or off. The addition of switches respectively coupled between ground and a voltage source and the drains of the switches that determine whether the charge pump is to function as a current source of a current sink improves the response time when turning off the charge pump. The addition of the capacitors respectively coupling slower nodes with a voltage signal or coupled between faster and slower nodes decreases the response time both when turning on and off the charge pump. The addition of the capacitors respectively coupling slower nodes and the UP and DNB control signals maximally decreases the response time both when turning on and off the charge pump. The present invention presents a clear improvement over the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A charge pump comprising:
a cascoded MOS transistor current mirror comprising a row of cascoded MOS transistors;
a first transistor of the row of cascoded MOS transistors controlling output of the charge pump according to a first control signal;
a second transistor of the row of cascoded MOS transistors coupled between a drain of the first transistor and a source of the third transistor of the row of cascoded MOS transistors, a drain of the third transistor coupled to an output of the charge pump;
a first capacitor having a first terminal coupled to the source of the third transistor and a second terminal coupled to a source of the second transistor; and
a first switch coupled between the source of the second transistor and ground and controlled by a second control signal that is an inverse of the first control signal.

2. A charge pump comprising:
a first switch coupled between a first voltage source and a first node, and controlled by a first control signal;
a second switch coupled between the first node and a second node;
a third switch coupled between the second node and a third node, the third node coupled to an output of the charge pump;
a fourth switch coupled between the third node and a fourth node;
a fifth switch coupled between the fourth node and a fifth node;
a sixth switch coupled between the fifth node and ground and controlled by a second control signal;
a first capacitor coupled between the second node and a first voltage signal; and
a second capacitor coupled between the fourth node and a second voltage signal;
wherein the first voltage signal is the first node.

3. The charge pump of claim 2 wherein the second voltage signal is the fifth node.

4. A charge pump comprising:
a first switch coupled between a first voltage source and a first node, and controlled by a first control signal;
a second switch coupled between the first node and a second node;
a third switch coupled between the second node and a third node, the third node coupled to an output of the charge pump;
a fourth switch coupled between the third node and a fourth node;
a fifth switch coupled between the fourth node and a fifth node;
a sixth switch coupled between the fifth node and ground and controlled by a second control signal;
a seventh switch coupled between ground and the first node and controlled by a third control signal that is an inverse of the first control signal;
an eighth switch coupled between a second voltage source and the fifth node and controlled by a fourth control signal that is an inverse of the second control signal;
a first capacitor coupled between the first node and the second node; and
a second capacitor coupled between the fourth node and the fifth node.

5. The charge pump of claim 4 wherein the first, second, third, and seventh switches are a first type of MOS transistors and the fourth, fifth, sixth, and eighth switches are of a second type of MOS transistors opposite from the first type of transistors.

6. The charge pump of claim 5 wherein the first type of MOS transistors is a P-MOS transistor and the second type of MOS transistors is an N-MOS transistor.

7. The charge pump of claim 5 wherein a drain of the first switch is coupled to a source of the second switch, a drain of the second transistor is coupled to a source of the third switch, a drain of the third switch is coupled to a drain of the fourth switch, a source of the fourth switch is coupled to a drain of the fifth switch, a source of the fifth switch is coupled to a drain of the sixth switch, a source of the seventh switch is coupled to the first node, a drain of the seventh switch is couple to ground, a source of the eighth switch is coupled to the fifth node, and a drain of the eighth switch is coupled to the second voltage source.

* * * * *